United States Patent [19]
Nakano

[11] Patent Number: 6,167,108
[45] Date of Patent: Dec. 26, 2000

[54] METHOD OF PROCESSING SIGNALS OF ENCODERS AND APPARATUS EMPLOYING THE SAME

[75] Inventor: Takuji Nakano, Tokyo, Japan

[73] Assignee: NEC Corporation, Tokyo, Japan

[21] Appl. No.: 09/258,908

[22] Filed: Mar. 1, 1999

[30] Foreign Application Priority Data

Mar. 3, 1998 [JP] Japan ................................. 10-066081

[51] Int. Cl.[7] ...................................................... G07C 3/00
[52] U.S. Cl. ................................................. 377/16; 377/30
[58] Field of Search ........................................ 377/30, 16

[56] References Cited

U.S. PATENT DOCUMENTS 5,276,722  1/1994  Aoki et al. ................................. 377/49
5,572,018  11/1996  Taniguchi et al. .................. 250/231.14

FOREIGN PATENT DOCUMENTS 56-58334  5/1981  Japan .
60-55226  3/1985  Japan .

Primary Examiner—Margaret R. Wambach
Attorney, Agent, or Firm—McGuireWoods LLP

[57] ABSTRACT

The present invention provides a method of processing signals of encoders and an apparatus employing the same by each of which increase and decrease of a counter value can be made to match an angle of a rotational angle of two-phase incremental encoders all the time. The apparatus includes: first and second change point detecting units for detecting the changes of output signals of Ach and Bch, respectively, which are outputted from incremental type encoders; first and second storage units for storing therein, at a time point when the change of one of the output values is detected by the first and second change point detecting units, the other output value; a past value storing unit for storing therein the value which is stored in at least one storage unit of the values which are stored last time in the first and second storage units; a logical judgement unit for determining the up/down direction of a counter on the basis of the values stored in the first and second storage units and in the past value storing unit; and a logical judgement unit for sending a clock.

11 Claims, 10 Drawing Sheets

METHOD OF PROCESSING SIGNALS OF ENCODERS AND APPARATUS EMPLOYING THE SAME

BACKGROUND OF THE INVENTION

1. Field of the Invention

The present invention relates to a method of processing signals of encoders and an apparatus employing the same by each of which addition or subtraction for a counter is carried out on the basis of output signals from two-phase incremental encoders to obtain absolute angle data.

2. Description of the Related Art

As well known, the chattering or the overshoot occurs in an output signal of an incremental optical encoder which is coupled to a stepping motor.

The chattering is the phenomenon in which the signal level is vibrated transiently in the process having the changing signal, and the occurrence causes thereof are as follows.

(1) The chattering occurs due to the fact that the mechanical vibration of the rotor is detected by the optical encoder.

In the stepping motor, the chattering due to the above-mentioned cause may readily occur in the vicinity of the detention positions.

(2) When the level of an output signal of a sensor becomes equal to or higher than an electrical threshold level, the chattering may readily occur in the output signal of the encoder due to the fluctuation of the level of the output signal of the sensor in the vicinity of the threshold level.

The chattering of this sort may occur due to the electrical noises as well as the mechanical vibration of the rotor as described above.

The overshoot is the phenomenon in which the encoder outputs the unscheduled signal when stopping the rotating motor or changing the rotational direction of the motor. The overshoot of this sort occurs in the case where the angular momentum remaining in the rotor of the motor when the rotor comes to the detention position is relatively larger than the amount of attenuation (the attenuation coefficient) which is obtained when the rotor moves to the position where the next output signal of the optical encoder changes.

In such a case, after having moved to the position where the next output signal of the optical encoder changes, the rotor of the motor intends to move back to the predetermined detent position again. Then, the overshoot is the phenomenon in which the momentum, which is overshot, is detected by the optical encoder.

While the foregoing is associated with the sides of the stepping motor and the optical encoder, in the case of the combination of an actuator with a position detector, in general, the problems associated with both of the chattering and the overshoot arise. On the other hand, when the rotor is moved smoothly, and also the stop ability is excellent, the chattering or the overshoot may not occur at all in some cases.

Incidentally, while the incremental optical encoder is the device wherein by inputting the output signal to the counter, the absolute angle data is produced to detect the position (the angle) of the rotor of the motor, there arises the problem that if the signal containing therein the above-mentioned chattering or overshoot is inputted to the counter, then the error occurs in the count value (the angle data).

As for the course of solving the above-mentioned problem, there is conceivable a course in which the encoder is prevented from outputting the chattering or the overshoot. However, this course invites the unreasonable results.

In actual, when selecting the motor, there may be the case where by taking occurrence of the chattering or the overshoot in output signal of the optical encoder into consideration, the torque which the motor generates is reduced (i.e., in the stepping motor, the local rotational speed becomes slow) or the attenuation coefficient is made large (i.e., the friction is generated) in order that the rotor may not have the too large angular momentum. In a word, this aims at forcedly providing the motor difficulties in moving, and hence there arises the unreasonableness that the measure taken for the output signal of the optical encoder results in the driving performance of the motor being limited.

In other words, since as described above, the mechanical vibration of the rotor of the stepping motor or the like appears in the output signal of the optical encoder so that the phenomena of the chattering or the overshoot occurs. If viewed in terms of the optical encoder itself, then the output signal of the optical encoder reflects faithfully the motion of the rotor and hence is normally operated.

Therefore, taking the measure of preventing the chattering and the overshoot from occurring in the output signal of the optical encoder results in that by increasing the viscosity of grease in the bearing and the harmonic gear or decreasing the torque output of the motor to eliminate the margin between the load torque and the output torque, or otherwise by making slow the electrical response speed of the optical encoder, the method is forced to be adopted wherein the output signal of the encoder is apparently made hardly changed.

Though, essentially, such a method is optionally provided for the purpose of measuring the angle of the rotor of the motor by the optical encoder, this becomes the cause of reducing the driving performance of the motor all the worse, and hence such a method would be preposterous as the means for solving the problem.

In order to radically solve the above-mentioned problem, it is required that on the assumption that the output signal of the optical encoder contains therein the chattering or the overshoot, the signal is processed within the circuit in the process of producing the angle data on the basis of the output signal of the optical encoder, thereby preventing any error from occurring in the final count value (the angle data).

In order to configure the circuit of this sort, it is required that in the optical encoder, the slits of two columns or more are formed therein in order to output the signals of two phases or more. If the phase of the output signal of the encoder is only one, when the chattering or the overshoot occurs in the associated output signal, it is to be understood that it is impossible to prevent the error from occurring in the count value.

Originally, the purpose of providing two-phase output signals of the optical encoders aims at that the rotational direction (the distinction between CW=clockwise rotation and CCW=counterclockwise rotation) is detected to control the up/down direction of the up/down counter, thereby enabling the angle of the motor capable of rotating in both of the directions CW and CCW to be measured.

For example, if the slits of the phase A and the phase B are formed at the same interval and also the slits of the phase B are shifted in the direction CCW by 90 degrees, then when examining the output signals of the encoders, the rotational direction can be detected in such a way that when the encoders output the signals with the phase A leading the phase B by 90 degrees, the motor rotates in the direction CW, while when the encoders output the signals with the phase A lagging the phase B by 90 degrees, the motor rotates in the direction CCW. Therefore, on the basis thereof, the up/down direction may be controlled.

Such an encoder in which the two-column slits which are 90 degrees out of phase are formed on the disk of the optical encoder is widely used in general.

When neither the chattering nor the overshoot occurs, the rotational angles of both of the directions CW and CCW can be readily detected by the combination of the two-phase optical encoders with the up/down counter.

In this connection, while in principle, the number of columns of slits may be increased, this results in the absolute encoder. Therefore, in order to make the best use of the advantages such as the small size and the low cost, the incremental encoders of two phases or up to three phases at the most having an index added thereto are commercially manufactured in general.

Then, the circuit is desirable in which the first point that the rotational angles of both of the directions CW and CCW can be detected using the signals of the two-phase incremental optical encoders is made compatible with the second point that no error occurs in the count value (the angle data) due to the chattering or the overshoot.

However, while for such a circuit, some methods have been attempted up to the present, the circuit in which the above-mentioned problems can be perfectly solved has not yet been provided.

As one example, the description will hereinbelow be given by taking a circuit which is disclosed in Japanese Patent Application Laid-Open No. Sho 60-55226. This circuit is the circuit wherein a count value is produced on the basis of output signals of two-phase incremental encoders, and is intended to prevent the wrong count operation from occurring due to the chattering.

FIG. 8 is a circuit diagram showing a configuration of the circuit which is disclosed in Japanese Patent Application Laid-Open No. Sho 60-55226. In the figure, leading and trailing signals (designated by reference symbols S3 to S6 in FIG. 9) of signals of phases A and B which have been inputted from two-phase incremental encoders through input terminals IN1 and IN2 are respectively produced by differentiation circuits 25 to 28. These leading and trailing signals S3 to S6 are generated at the change points of the signals of the phases A and B, and are then held by flip-flops 40 to 43 at the rise of a clock pulse (designated by reference symbol S7 in FIG. 9) which is delayed by a predetermined time constant (designated by reference symbol T in FIG. 9) and also their output signals (designated by reference symbols S8 to S11 in FIG. 9) are held until a rise time of the next clock pulse.

Then, on the basis of the states of those output signals S8 to S11, a counter-up signal and a counter-down signal (designated by reference symbols Pu and Pd, respectively, in FIG. 9) are outputted. Therefore, if the pulse width of the chattering is shorter than the pulse width (designated by reference symbol t in FIG. 9) of each of the leading and trailing signals, then the chattering is excluded. In addition, even if the pulse width of the chattering is longer than t, then the states of the signals are held in the flip-flops 40 to 43 with those signals delayed by the delay time T. As a result, at a time point of occurrence of the chattering, the setting conditions of NOR circuits 44 to 51 are not fulfilled so that the chattering is excluded.

However, even in the circuit shown in FIG. 8, there arise the following problems.

(1) When the signals of the phases A and B as shown in FIG. 9 are inputted to the circuit shown in FIG. 8, it is understood that in actual, the count value is different from the encoder position (i.e., the proper information) due to the chattering in the signal of the phase A.

(2) There is the possibility that the circuit shown in FIG. 8 may generate the error of the count value due to the direction conversion of the encoders. That is, when the direction conversion of the encoders occurs in the middle of the operation as shown in FIG. 10, it is understood that the count value is different from the encoder position (i.e., the proper information) due to the direction conversion.

In this connection, for the overshoot (when the encoder signal is overshot instantaneously by ¼ cycle to be returned to the original state), it can be verified by drawing the timing chart similarly that the wrong information is generated in that circuit.

SUMMARY OF THE INVENTION

In the light of the foregoing, the present invention has been made in order to solve the above-mentioned problems associated with the prior art, and it is therefore an object of the present invention to provide a method of processing signals of encoders and an apparatus employing the same by each of which increase and decrease of the counter value can be made to match an angle of a rotational angle of two-phase incremental encoders all the time.

The inside of an encoder is constructed in such a way that a disk (an encoder disk) in which slits are formed is coupled to c rotor, and a sensor for detecting the slits of the encoder disk is mounted to a stator, and a signal of the sensor is outputted.

Therefore, to which value the output signal of the encoder corresponds when the rotor is at an arbitrary angle can be uniquely determined on the basis of the positional relation in construction if the mechanical flexibility of the constructional members, the decentering of the axis, and the electrical response delay of the sensor are disregarded.

As will hereinbelow be described, the above-mentioned relation is held even if the chattering or the overshoot occurs in the output signal of the encoder. Therefore, the chattering or the overshoot is outputted as a result of detecting faithfully (too sensitively) the transient motion of the rotor by the encoder, and hence it is not the case that the encoder itself makes the wrong operation.

Therefore, in terms of the counter circuit, for the signal which is inputted under the condition that the relation between the angle of the rotor and the output value is held within the fixed error range on the basis of the encoder signal, the count value has only to match the angle of the rotor.

If the relation between the angle of the rotor and the output value should not be held unconditionally, even though any method is adopted, there may happen the case where the error occurs in the count value. In principle, it is impossible to avoid such a case.

Then, the present invention may provide a method in which addition or subtraction for a counter is carried out on the basis of two 1 bit output signals which are outputted from an incremental type encoder and which are out of phase, wherein the addition or subtraction for the counter is carried out on the basis of the past values of the output signals.

Further, the present invention may provide an processing apparatus in which addition or subtraction for a counter is carried out on the basis of two 1 bit output signals which are outputted from an incremental type encoder and which are out of phase, the apparatus including addition/subtraction means for carrying out the addition or subtraction for the counter on the basis of the past values of the output signals.

DETAILED DESCRIPTION OF THE PREFERRED EMBODIMENTS

The preferred embodiment of the present invention will hereinafter be described in detail with reference to the accompanying drawings.

FIG. 1 is a functional block diagram showing a configuration of a circuit for processing signals of encoders according to an embodiment of the present invention. In the figure, reference numerals 101 and 102 designate respectively a sensor of A-channel(Ach) and a sensor of B-channel(Bch) which are included in two-phase incremental encoders. The changes in the output signals from the sensors 101 and 102 are detected by change point detecting units 103 and 104, respectively.

The value of Ach when the change occurs in Bch is stored in a storage unit 105. Each of the storage units 105, 106 and 107 is constituted by a register, an F/F (a flip-flop) and the like. In addition, the value of Bch at a time point when the change occurs in Ach is stored in turn in the storage units 106 and 107. Each of the storage units 106 and 107 is, for example, constituted by a shift register circuit.

A logical judgement unit 108 sets the up/down direction of a counter 111 on the basis of the value of Ach, at the final change point of Bch, which is stored in the storage unit 105, the value of Bch, at the final change point of Ach, which is stored in the storage unit 106, and the value of Bch, at the last change point of Ach, which is stored in the storage unit 107, in accordance with the following logical relation shown in Table 1.

TABLE 1

| which signal when signal | A final change point of B | B last change point of A | B current change point of A | up/down direction set in counter |
|---|---|---|---|---|
| value |  | 0 | 1 | DOWN |
|  | 0 | 1 | 0 | UP |
|  |  | 0 | 1 | Up |
|  | 1 | 1 | 0 | DOWN |
|  | — | 0 | 0 | DON'T CARE |
|  | — | 1 | 1 | |

In addition, a logical judgement unit 109 and a clock sending unit 110 serve to send a clock signal to the counter 111 on the basis of the value of Bch, at the final change point of Ach, which is stored in the storage unit 106, and the value of Bch, at the last change point of Ach, which is stored in the storage unit 107, in accordance with the following logical relation shown in Table 2.

TABLE 2

| which signal when signal | B last change point of A | B current change point of A | whether or not which number of clocks is sent |
|---|---|---|---|
| value | 0 | 1 | clock to move 1 bit of counter value is sent |
|  | 1 | 0 |  |
|  | 0 | 0 | No clock is sent |
|  | 1 | 1 |  |

The clock signal is sent from the clock sending unit 110, and whenever the values in the storage units 106 and 107 change, the count value (the angle data) of the counter 111 changes.

Therefore, since whenever the change occurs in Ach, the value of the counter 111 changes, with respect to the up/down direction as well of the counter 111 the data of which is set in the logical judgement unit 108, the direction which is set whenever the change occurs in Ach exerts an influence on the counter value.

Summarizing the foregoing, the following logical relation shown in Table 3 is obtained.

TABLE 3

| | At change point of A, | | | |
|---|---|---|---|---|
| which | A | B | | |
| signal when signal | final change point of B | last change point of A | current change point of A | clock sent to counter |
| value | 0 | 0 | 1 | −1 |
|  |  | 1 | 0 | +1 |
|  | 1 | 0 | 1 | +1 |
|  |  | 1 | 0 | −1 |
|  | — | 0 | 0 | 0 |
|  |  | 1 | 1 | 0 |

Next, the description will hereinbelow be given with respect to the operation of the circuit for processing signals of encoders of the present embodiment with reference to FIGS. 2 to 6.

FIG. 2 shows the relation between slits and output signals of the two-phase incremental optical encoder, which is coupled to a stepping motor, with the axis of abscissa as the angle. In addition, in this example, it is assumed that the detent positions of the stepping motor are present in the vicinity of the leading and trailing edges of the signal of Ach. In each of the detect positions, the output signal of Ach becomes valid.

FIG. 3 is a timing chart, when driving the stepping motor, with the axis of abscissa as time. Then, FIG. 3 shows the state in which the direction is changed from CW to CCW in the middle of the operation. In addition, it is assumed that each of the output signals of Ach and Bch generates the chattering at the change point.

Figure 1:
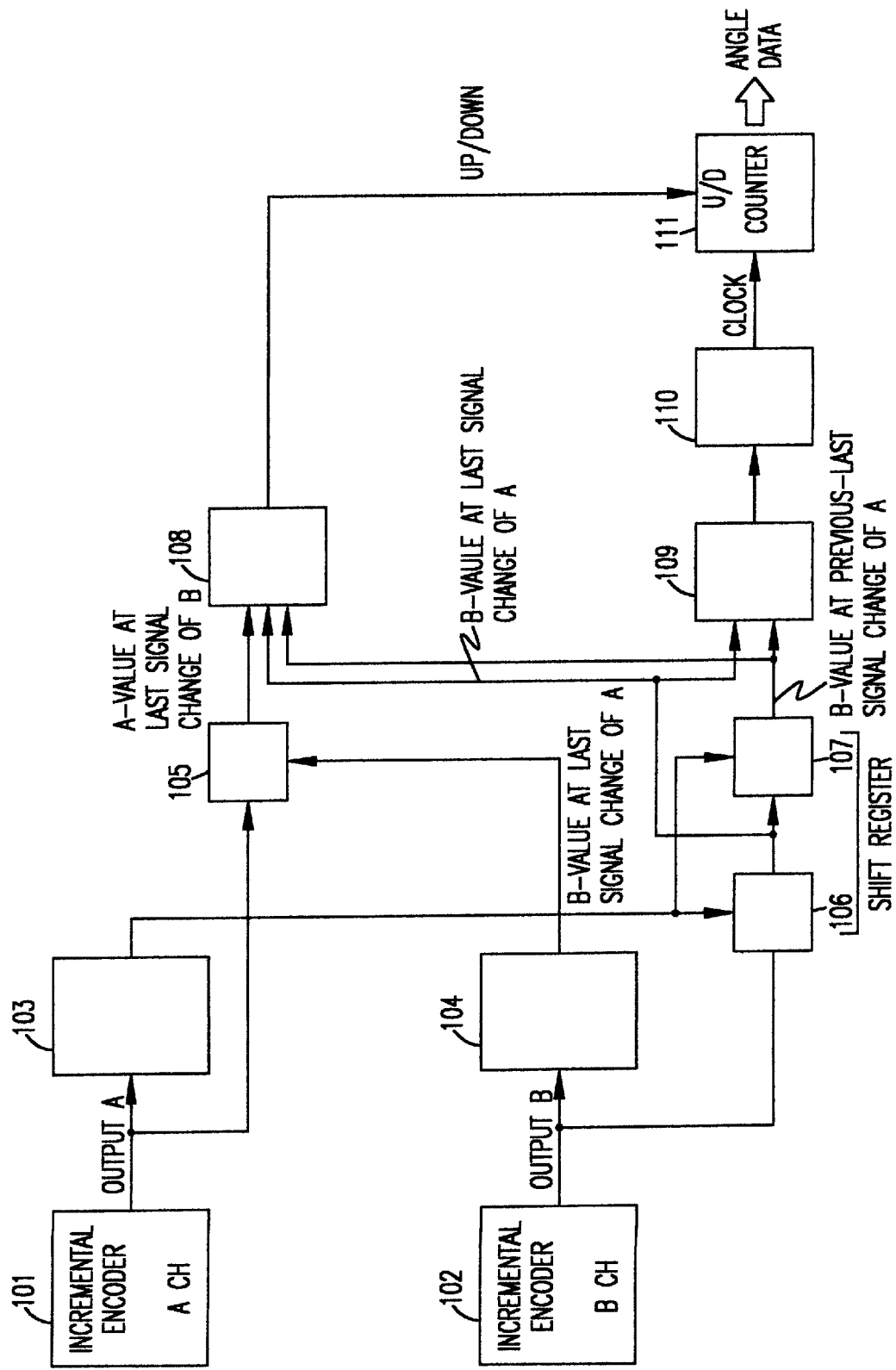
Figure 2:
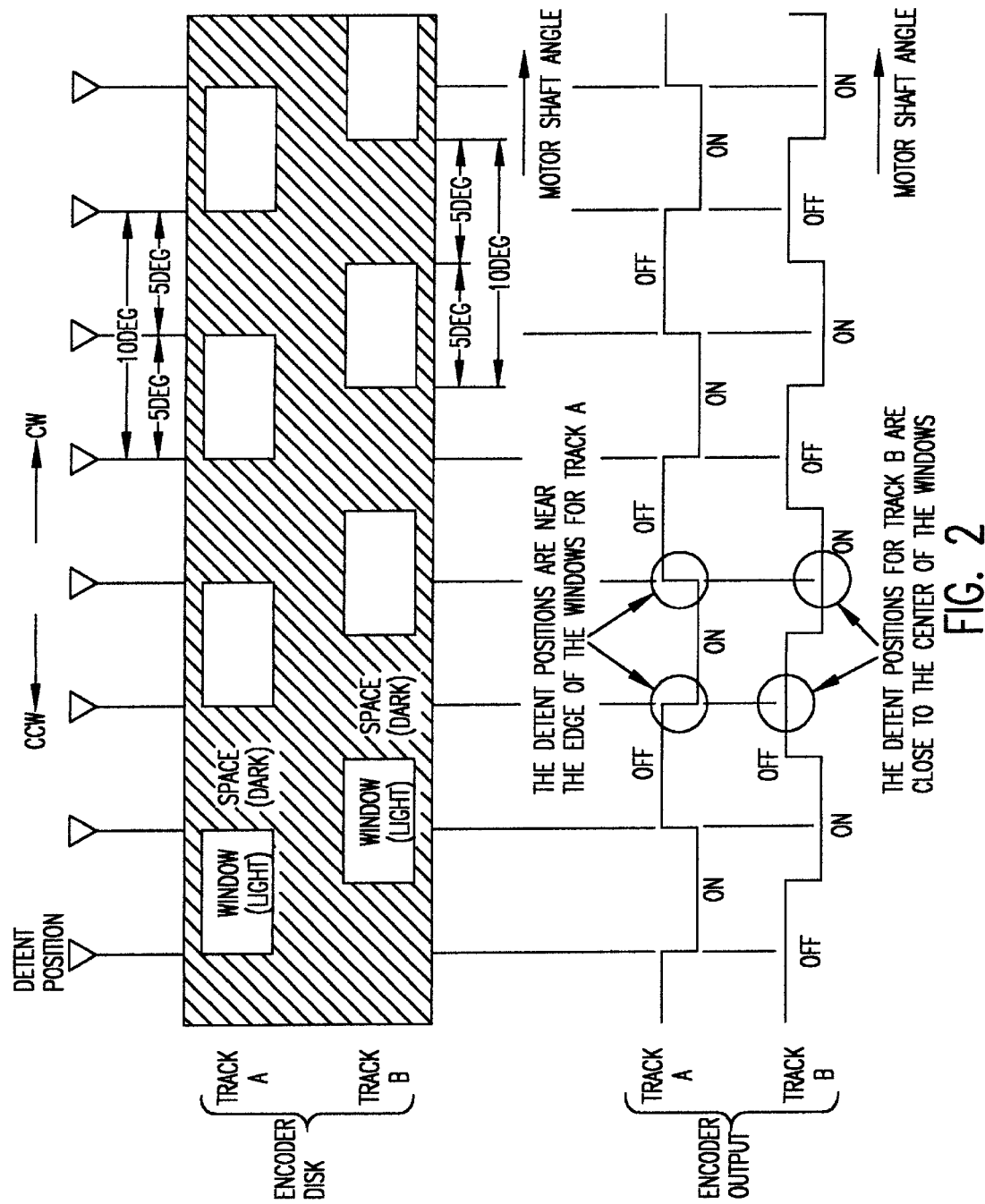
Figure 3:
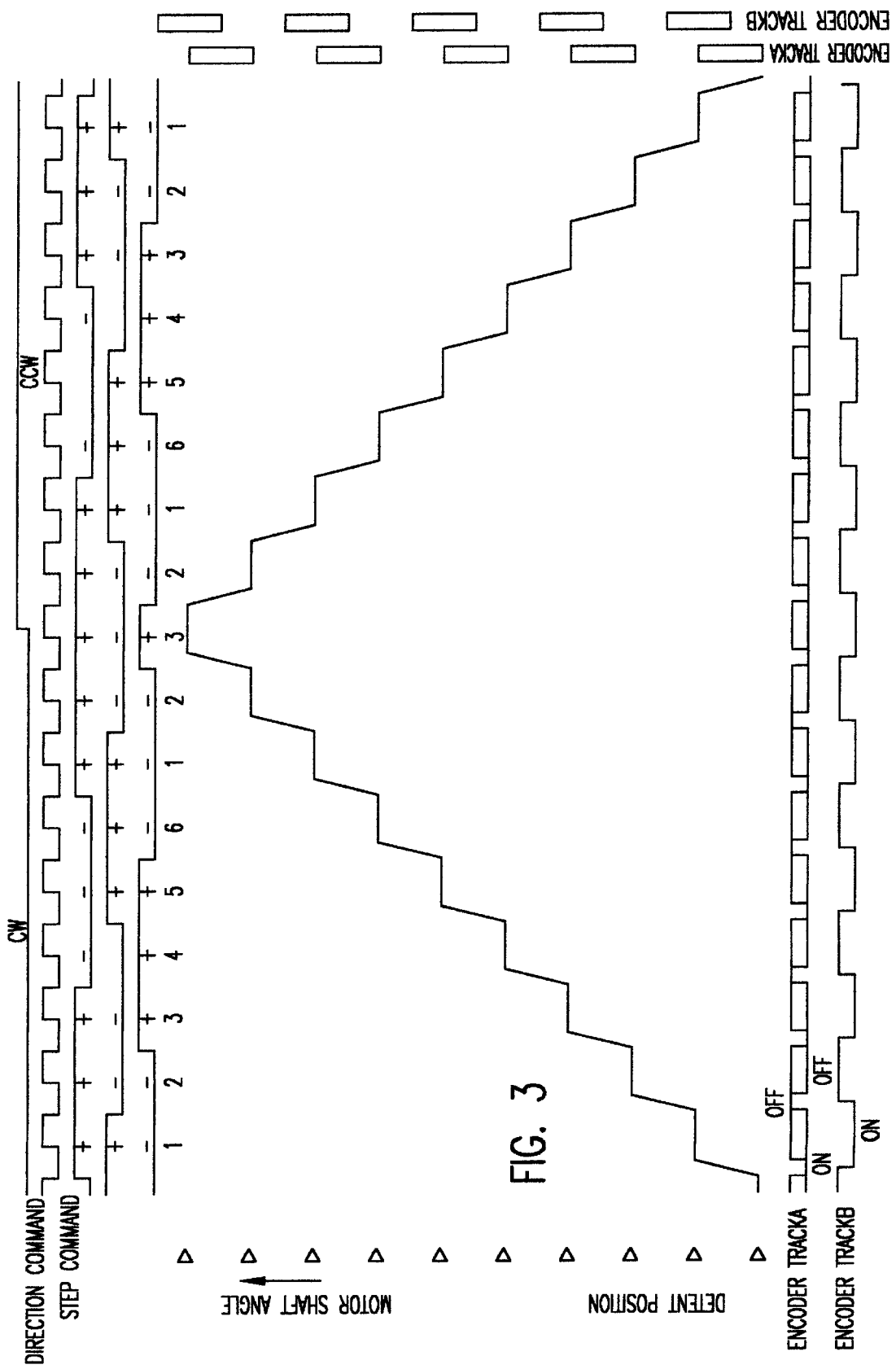
Figure 7:
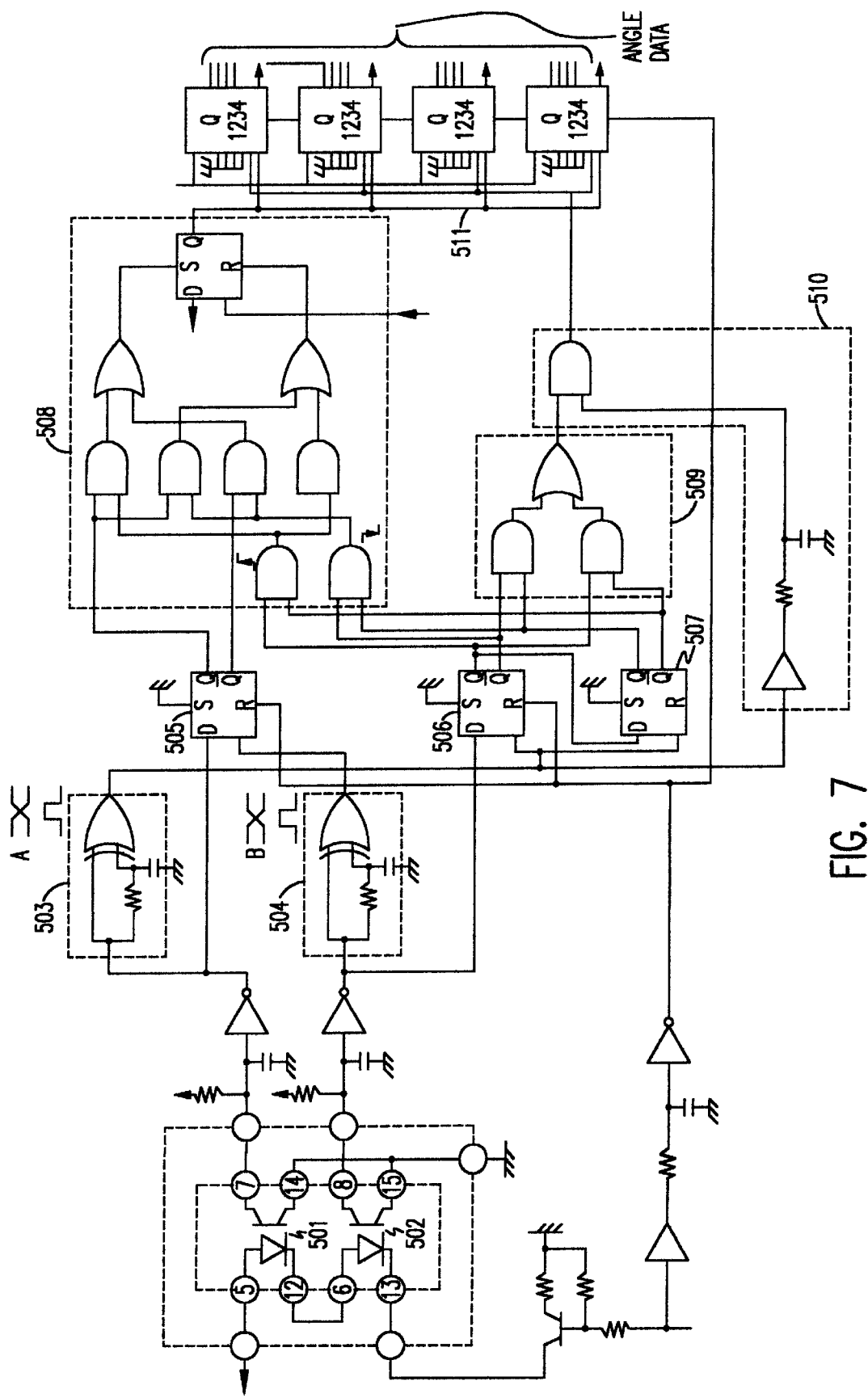
Figure 8:
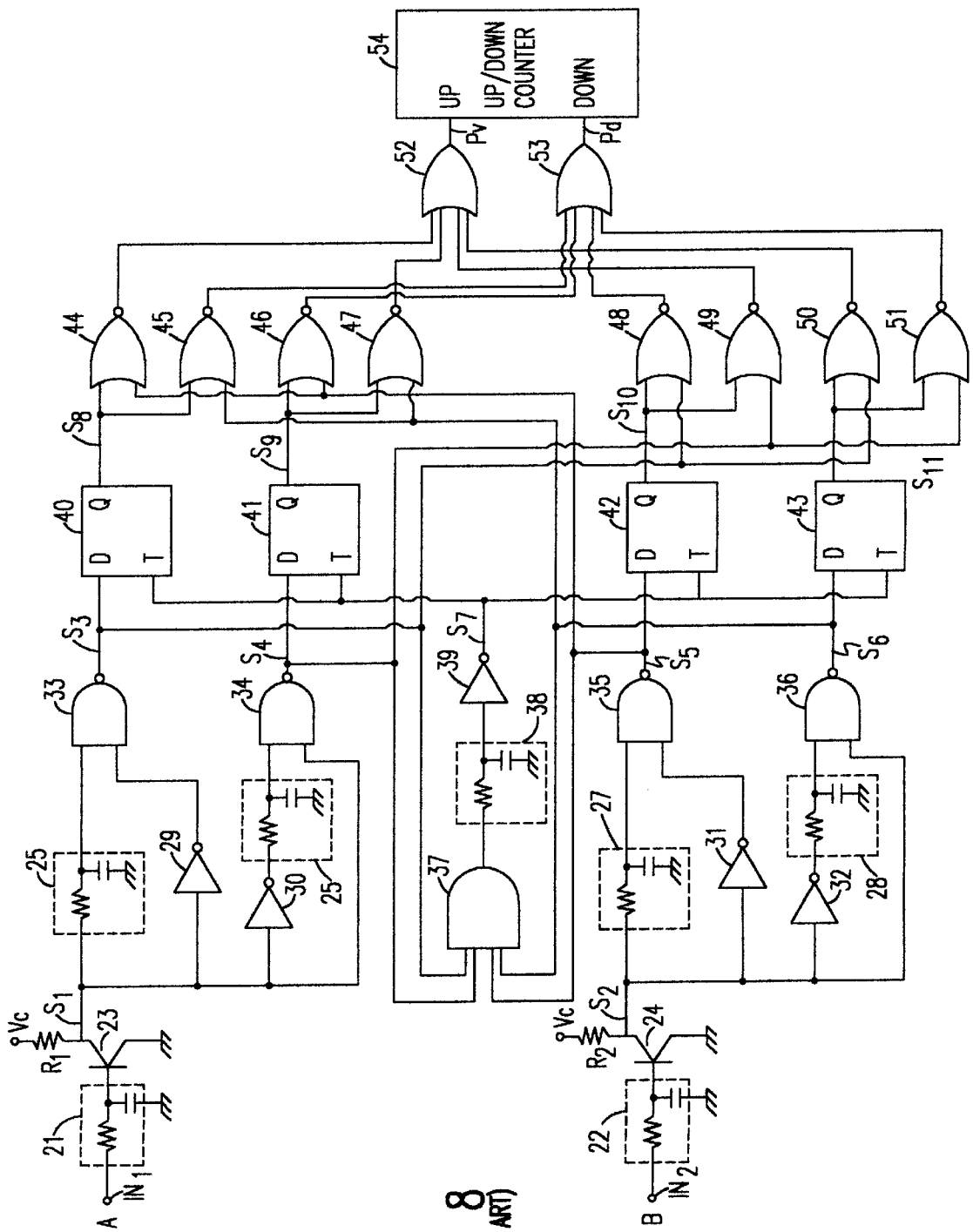
Figure 9:
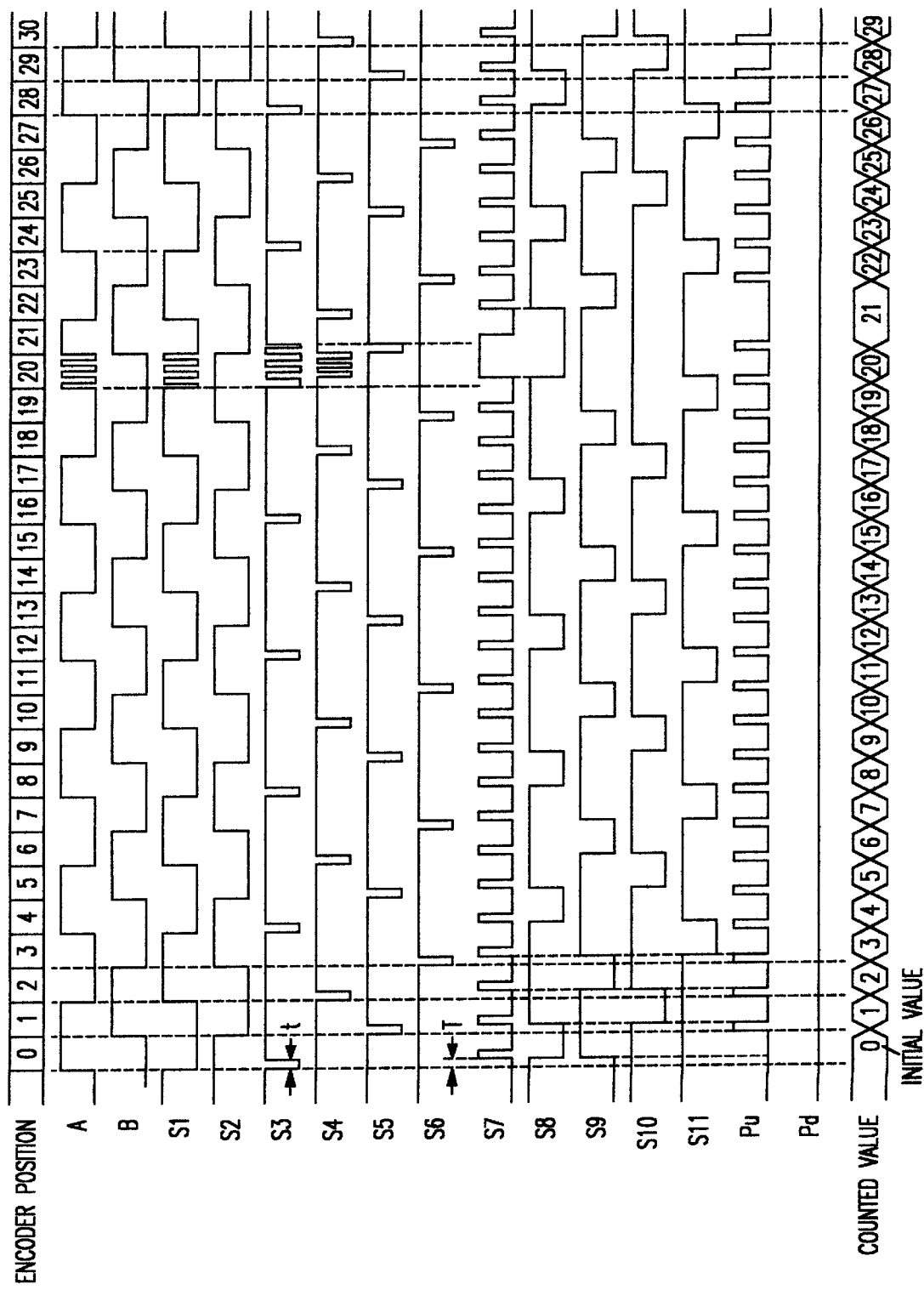
Figure 10:
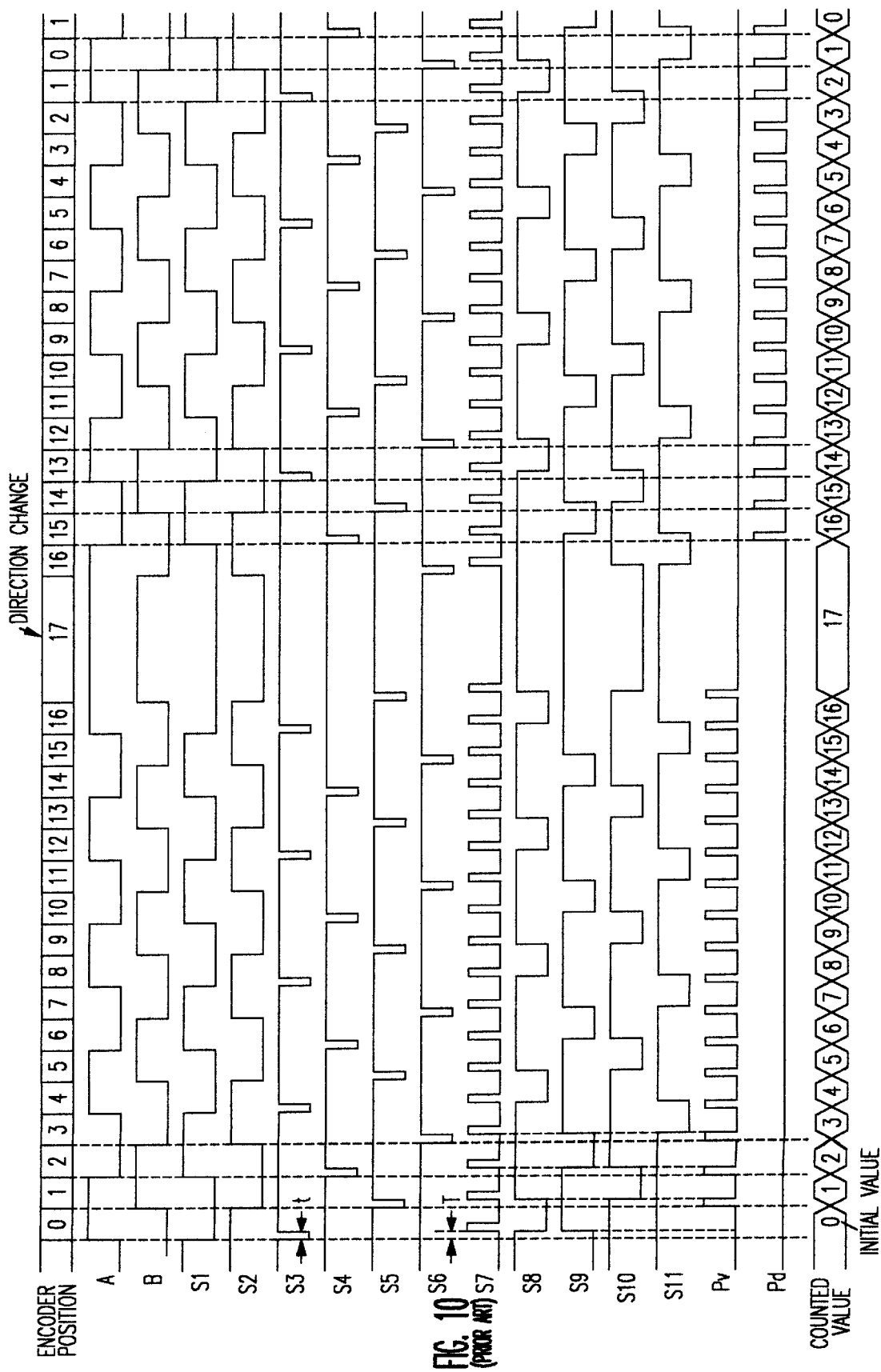

FIG. 7 is a circuit diagram showing a concrete configuration of the circuit shown in FIG. 1. In the figure, with respect to the constituent elements in which the lower two digits of reference numerals of 100's in FIG. 1 are the same as those of reference numerals of 500's in FIG. 7, the constituent elements of FIG. 7 are the same as those of FIG. 1. Reference numerals 501 and 502 designate respectively a sensor of Ach and a sensor of Bch of the two-phase incremental optical encoders. Reference numerals 503 and 504 designates respectively change point detecting circuits for producing mono-pulses at the change points of Ach and Bch of the encoders. Reference numeral 505 designates a flip-flop for storing therein the value of Ach at the change point of Bch. Reference numerals 506 and 507 designate respectively shift registers for storing therein in turn the value of Bch at the change point of Ach. Reference numeral 508 designates a logical circuit for setting the up/down direction of a counter 511. Reference numerals 509 and 511 designate respectively a logical circuit and a clock sending circuit which serve to send one clock signal to the counter 511 in correspondence to the change of the values stored in the shift registers 506 and 507. Reference numeral 511 designates the up/down counter for outputting the angle data. This counter 511 is constituted by four binary up/down counters and the output signals of those binary up/down counters are respectively outputted in parallel from the output terminals Q1 to Q4 to form one angle data.

The operation of the circuit shown in FIG. 7 corresponds to that of the circuit shown in FIG. 1. Now, the value of Ach at the change point of Bch is set in the output terminal Q of the flip-flop 505; the value of Bch at the last change point of Ach is set in the output terminal Q of the shift register 507; the value of Bch at the final change point of Ach is set in the output terminal Q of the shift register 506; and the up/down direction of the counter 511 is set in the output terminal Q of She flip-flop of the logical circuit 508. The clock signal to the counter 511 is the output signal of the AND circuit of the clock sending circuit 510, and the count values (the angle data) are the output signals from the output terminals Q1 to Q4 of the counter 511.

The signal processing circuit for the encoders of the present embodiment detects, at a time point when the change occurs in one of the output signals of Ach and Bch of the two-phase incremental encoders, the value of the other output signal, and on the basis of the logical relation between those values, controls both of the up/down direction of the counter and sending of the clock signal. For this reason, whether the change at the change point of the encoder outputs corresponds to the leading edge or the trailing edge does not exert an influences on the operation of the counter.

In addition, since the encoder output signals which are out of phase change alternately (do not change at the same time), at the change point of one encoder output signal, the value of the other encoder output signal is decided. The transition of the value has the fixed regularity depending on the rotational direction, and hence by controlling the counter in the manner as in the above Table 3, the absolute angle data can be produced on the basis of the encoder output signals, and also the count value prevents the error from occurring due to the direct-on conversion, the chattering, and the overshoot.

Therefore, the circuit for processing signals of encoders according to the present embodiment has the following effects.

Figure 4:
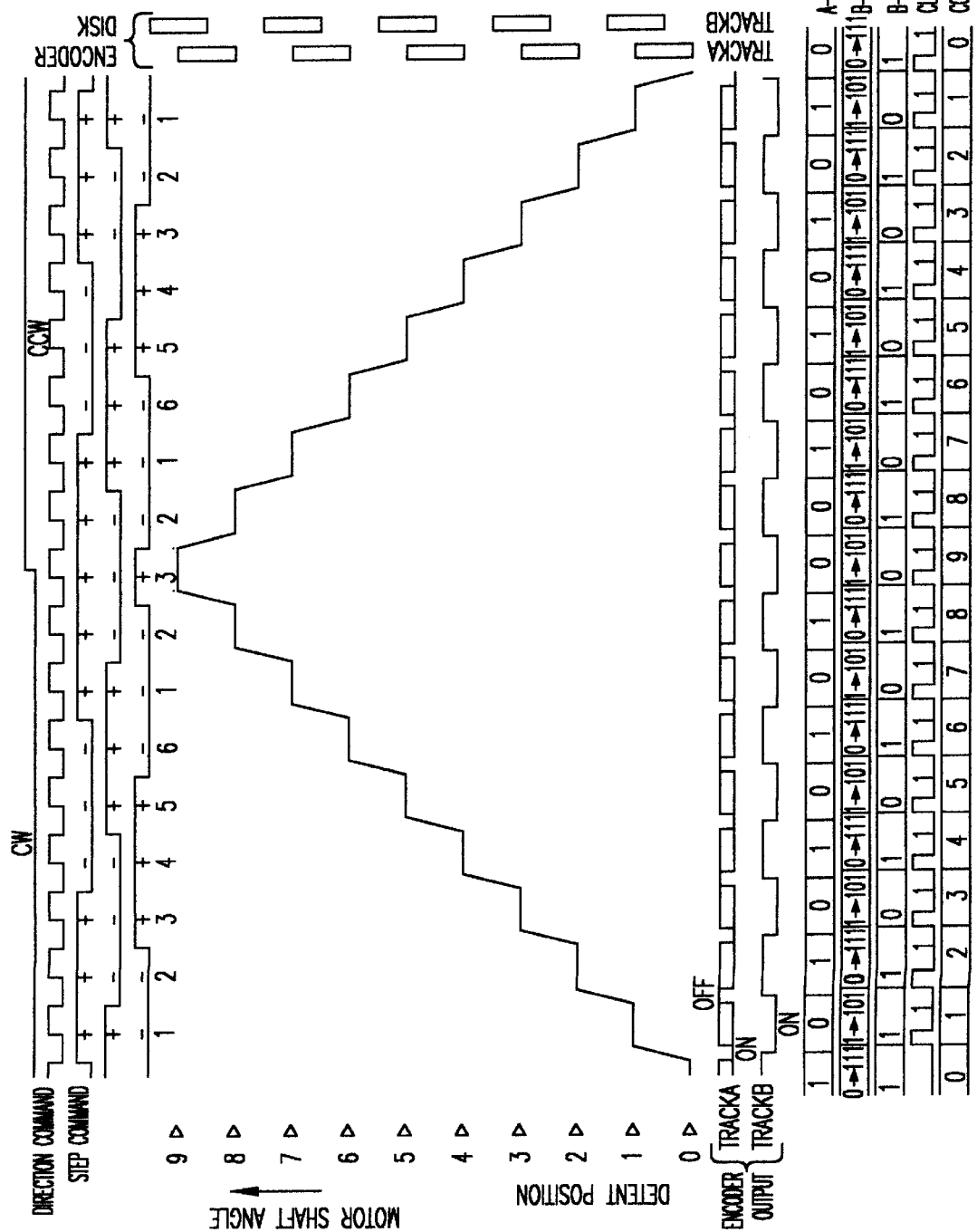
FIG. 4 is a timing chart showing the change of the count value in the circuit shown in FIG. 1 under the condition of FIG. 3. From the figure, it is understood that the position (the angle) of the rotor matches the count value in real time all the time.
Figure 5:
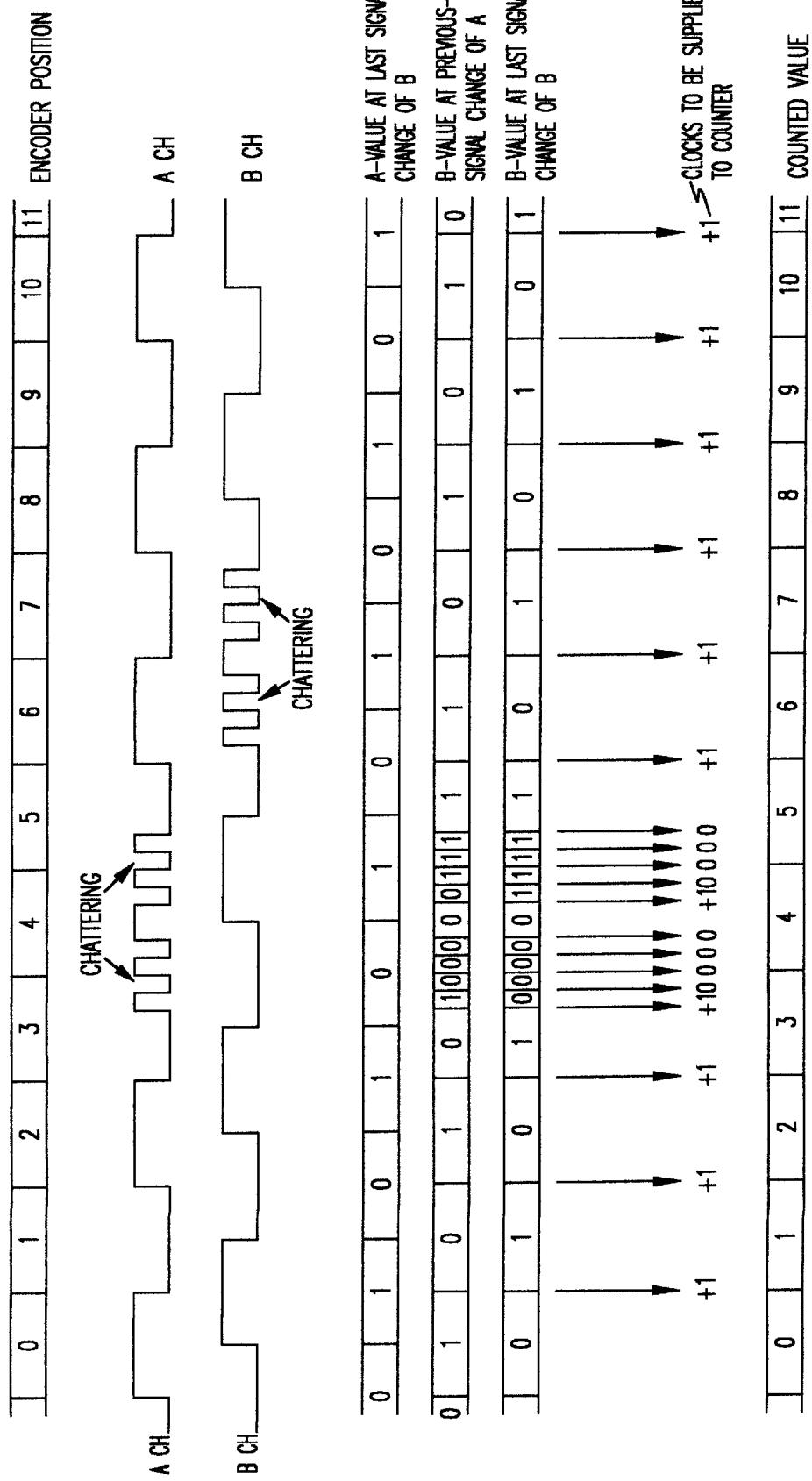
FIG. 5 shows the change of the count value in the circuit shown in FIG. 1 in the case where the chattering occurs in the output signals of Ach and Bch under the condition of FIG. 3. From the figure, it is understood that though the chattering occurs therein, the position (the angle) of the rotor matches the count value in real time all the time.
Figure 6:
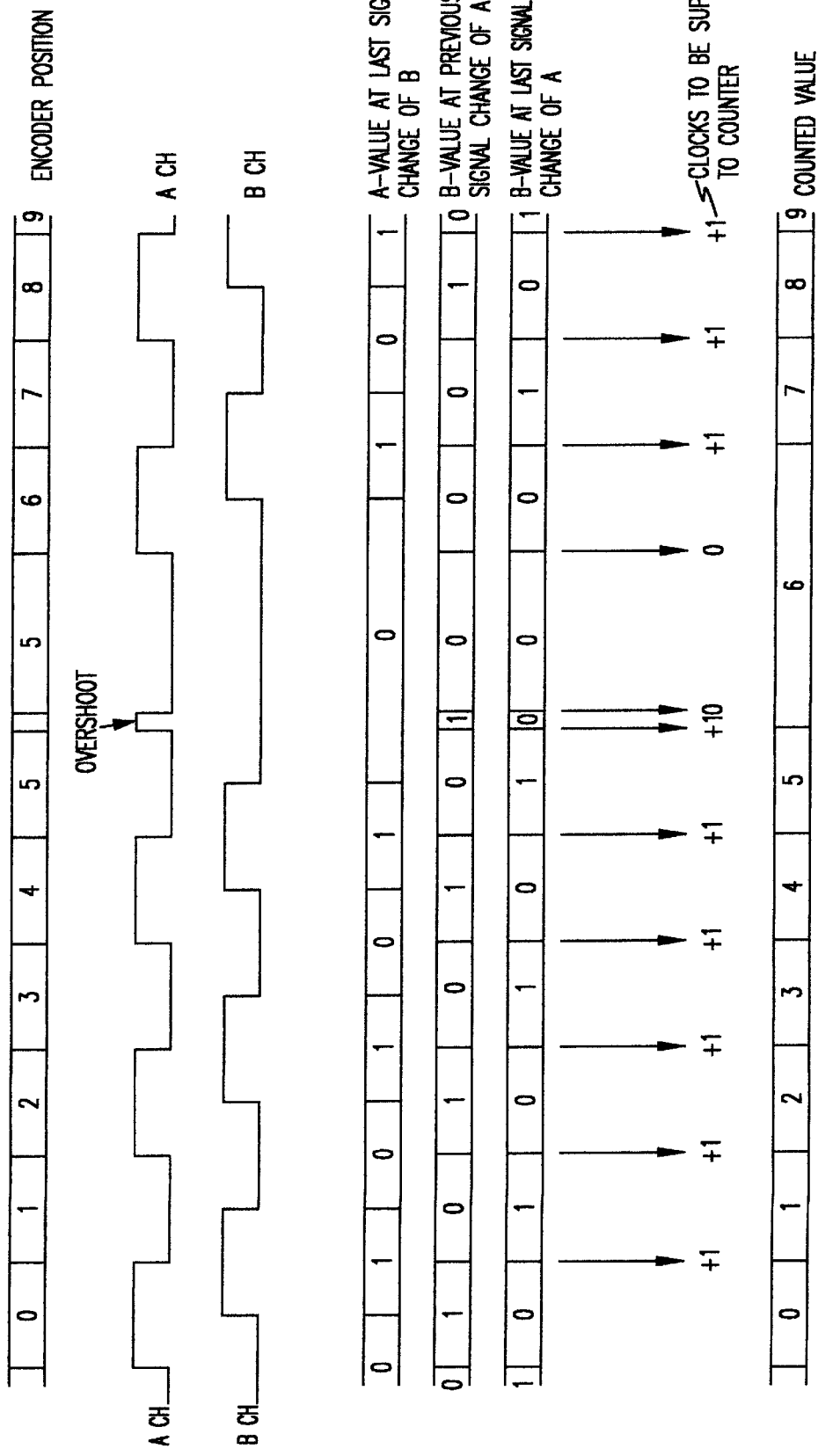
FIG. 6 shows the change of count value in the circuit shown in FIG. 1 in the case where the overshoot occurs in the output signal of Ach under the condition of FIG. 3. From the figure, it is understood that though the overshoot occurs therein, the position (the angle) of the rotor matches the count value in real time all the time.

The first effect is such that the circuit of interest is established as the circuit for producing the absolute angle data on the basis of the output signals from the two-phase incremental encoders which rotate in both of the directions CW and CCW. This reason is that, as shown in FIG. 4, the angle of the rotor matches the count value in real time all the time.

The second effect is such that even if the chattering occurs in any of the output signals of the encoders, this does not exert an influence on the count value (the angle data) at all.

The third effect is such that even if the overshoot occurs in any of the output signals of the encoders, this does not exert an influence on the count value (the angke data) at all.

In this connection, since the overshoot is the phenomenon in which the pulse signal is overshot by one pulse or more to be returned to the original state, if the error does not occur in the direction conversion, with respect to the overshoot as well, no error occurs.

Incidentally, in the present embodiment, the present invention is not limited to the circuits shown in FIGS. 1 and 7, and hence it is possible to adopt a circuit which is suitable when the present invention is applied thereto. As one example, there may be adopted the circuit which realizes the following logical relation shown in Table 4.

TABLE 4

| signal when | A | | B | | Clock | |
|---|---|---|---|---|---|---|
| | Last | current | last | current | sent to counter | |
| | change point of B | change point of B | change point of A | change point of A | Change point of A | Change point of B |
| value | — | 0 | 0 | 1 | −1 | |
| | — | 0 | 1 | 0 | +1 | |
| | — | 1 | 0 | 1 | +1 | |
| | — | 1 | 1 | 0 | −1 | |
| | — | — | 0 | 0 | 0 | |
| | — | — | 1 | 1 | 0 | |
| | 0 | 1 | — | 0 | | +1 |
| | 1 | 0 | — | 0 | | −1 |
| | 0 | 1 | — | 1 | | −1 |
| | 1 | 0 | — | 1 | | +1 |
| | 0 | 0 | — | — | | 0 |
| | 1 | 1 | — | — | | 0 |

In addition, with respect to the above-mentioned constructional members, the number, the positions, the shapes and the like thereof are not limited to those of the above-mentioned embodiment, and hence it is possible to adopt the number, positions, shapes and the like which are suitable when implementing the present invention.

Incidentally, in the figures, the same constituent elements are designated by the same reference numerals.

Since the present invention is constructed as described above, it is possible to realize a method of processing signals of encoders and an apparatus employing the same by each of which increase and decrease of a counter value can be made to match an angle of a rotational angle of two-phase incremental encoders all the time.

This invention being thus described, it will be obvious that the same may be varied in various ways. Such variations are not to be regarded as departure from the spirit and scope of the invention, and all such modifications would be obvious for one skilled in the art intended to be included within the scope of the following claims.

What is claimed is:

1. A method of counting-up or counting-down a counter on the basis of two 1-bit output signals which are outputted from an incremental type encoder and which are out of phase,
    wherein counting-up or counting-down for said counter is carried out on the basis of past values of the output signals.

2. A method of counting-up or counting-down a counter on the basis of two 1-bit output signals which are outputted from an incremental type encoder and which are out of phase, wherein at a time point when one of the output signals changes, a value of the other output signal is stored, and the count-up or count-down for said counter is carried out on the basis of the stored values.

3. A method of counting-up or counting-down a counter on the basis of two 1-bit output signals which are outputted from an incremental type encoder and which are out of phase, wherein at a time point when first one of the output signals changes, a value of the second one output signal is successively stored, and at a time point when the second one of the output signals changes, a value of the first one output signal is stored, and the count-up or count-down for said counter is carried out on the basis of the successively stored values of said second one of the output signals and the stored value of said first one of the output signals.

4. A method according to claim 3, wherein when the successively stored values are different, the count-up or count-down for said counter is carried out.

5. A apparatus for counting-up or counting-down a counter on the basis of two 1-bit output signals which are outputted from an incremental type encoder and which are out of phase, wherein counting-up or counting-down for said counter is carried out on the basis of past values of the output signals.

6. A apparatus for counting-up or counting-down a counter on the basis of two 1-bit output signals which are outputted from an incremental type encoder and which are out of phase, wherein at a time point when one of the output signals changes, a value of the other output signal is stored, and the count-up or count-down for said counter is carried out on the basis of the stored values.

7. A apparatus for counting-up or counting-down a counter on the basis of two 1-bit output signals which are outputted from an incremental type encoder and which are out of phase, wherein at a time point when first one of the output signals changes, a value of the second one output signal is successively stored, and at a time point when the second one of the output signals changes, a value of the first one output signal is stored, and the count-up or count-down for said counter is carried out on the basis of the successively stored values of said second one of the output signals and the stored value of said first one of the output signals.

8. An apparatus in which addition or subtraction for a counter is carried out on the basis of two 1 bit output signals which are outputted from an incremental type encoder and which are out of phase, said apparatus comprising addition/subtraction means for carrying out the addition or subtraction for said counter on the basis of the past values of the output signals.

9. An apparatus in which addition or subtraction for a counter is carried out on the basis of two 1 bit output signals which are outputted from an incremental type encoder and which are out of phase, said apparatus comprising:

first and second output value storing means for storing therein, at a time point when one of the output signals changes, a value of the other output signal; and counter addition/subtraction means for carrying out the addition or subtraction for said counter on the basis of the values stored in said first and second output value storing means.

10. An apparatus in which addition or subtraction for a counter is carried out on the basis of two 1 bit output signals which are outputted from an incremental type encoder and which are out of phase, said apparatus comprising:

first and second output change detecting means for detecting changes of the output signals, respectively;

first and second output value storing means for storing therein, at a time point when a change of one of the output signals has been detected by said first and second output change detecting means, first values of the other output signal;

past value storing means for holding therein second values which are stored in at least one output value storing means of the first values which are stored last time in said first and second output value storing means; and counter addition/subtraction means for carrying out the addition or subtraction for said counter on the basis of the first and second values stored in said first and second output value storing means and in said past value storing means.

11. An apparatus according to claim 10, wherein when the first values stored in said first and second output value storing means are different from the second values stored in said past value storing means, the addition or subtraction for said counter is carried out.

* * * * *